(12) United States Patent
Heinemann et al.

(10) Patent No.: US 7,595,534 B2
(45) Date of Patent: Sep. 29, 2009

(54) LAYERS IN SUBSTRATE WAFERS

(75) Inventors: Bernd Heinemann, Frankfurt (DE);
Karl-Ernst Ehwald, Frankfurt (DE);
Dieter Knoll, Frankfurt (DE); Bernd Tillack, Frankfurt (DE); Dirk Wolansky, Frankfurt (DE); Peter Schley, Frankfurt (DE)

(73) Assignee: IHP GmbH-Innovations for High Performance Microelectronics/Institut fur Innovative Mikroelektronik, Frankfurt (DE)

( * ) Notice: Subject to any disclaimer, the term of this patent is extended or adjusted under 35 U.S.C. 154(b) by 0 days.

(21) Appl. No.: 10/433,969

(22) PCT Filed: Dec. 6, 2001

(86) PCT No.: PCT/EP01/14318

§ 371 (c)(1),
(2), (4) Date: Nov. 17, 2003

(87) PCT Pub. No.: WO02/47113

PCT Pub. Date: Jun. 13, 2002

(65) Prior Publication Data

US 2004/0075118 A1    Apr. 22, 2004

(30) Foreign Application Priority Data

Dec. 8, 2000   (DE) ................................ 100 61 191

(51) Int. Cl.
*H01L 29/76* (2006.01)
*H01L 29/94* (2006.01)
*H01L 31/062* (2006.01)
*H01L 31/113* (2006.01)

(52) U.S. Cl. ...................... 257/376; 257/372; 257/373; 257/374; 257/394

(58) Field of Classification Search ................ 257/205, 257/372–374, 376, 394
See application file for complete search history.

(56) References Cited

U.S. PATENT DOCUMENTS 4,053,925 A * 10/1977 Burr et al. .................... 257/376

(Continued)

FOREIGN PATENT DOCUMENTS

DE         4415600         11/1995

(Continued)

OTHER PUBLICATIONS

Tsukamoto, K. et al: "High-energy ion implantation for USLI", Nuclear Instruments and Methods in Physics Research, Section B: Beam Insteractions With Materials and Atoms, North-Holland Publishing Company, Amsterdam, NL, vol. B59/60, Jul. 1, 1991, pp. 584-591 (XP002080680).

(Continued)

*Primary Examiner*—Shouxiang Hu
(74) *Attorney, Agent, or Firm*—Ware, Fressola, Van Der Sluys & Adolphson, LLP

(57) ABSTRACT

The invention relates to layers in substrate wafers. The aim of the invention is to provide layers in substrate wafers with which the drawbacks of conventional assemblies are overcome in order to achieve, on the one hand, an adequate resistance to latch-up in highly scaled, digital CMOS circuits with comparatively low costs and, on the other hand, to ensure low substrate losses/couplings for analog high-frequency circuits and, in addition, to influence the component behavior in a non-destructive manner. To these ends, the invention provides that in a highly resistive p-Si substrate (2) with one or more buried high-carbon Si layers (3) under an epitaxial layer and with the Si cap layer (4), an implantation dose, which is greater in comparison to conventional substrate wafers, is used for retrograde trough profiles by suppressing the dopant diffusion as well as the generation of defects when remedying implant defects, thereby achieving a reduction of the trough resistance, and finally, an increase in the resistance to latch-up.

10 Claims, 8 Drawing Sheets

U.S. PATENT DOCUMENTS

Figure 1:
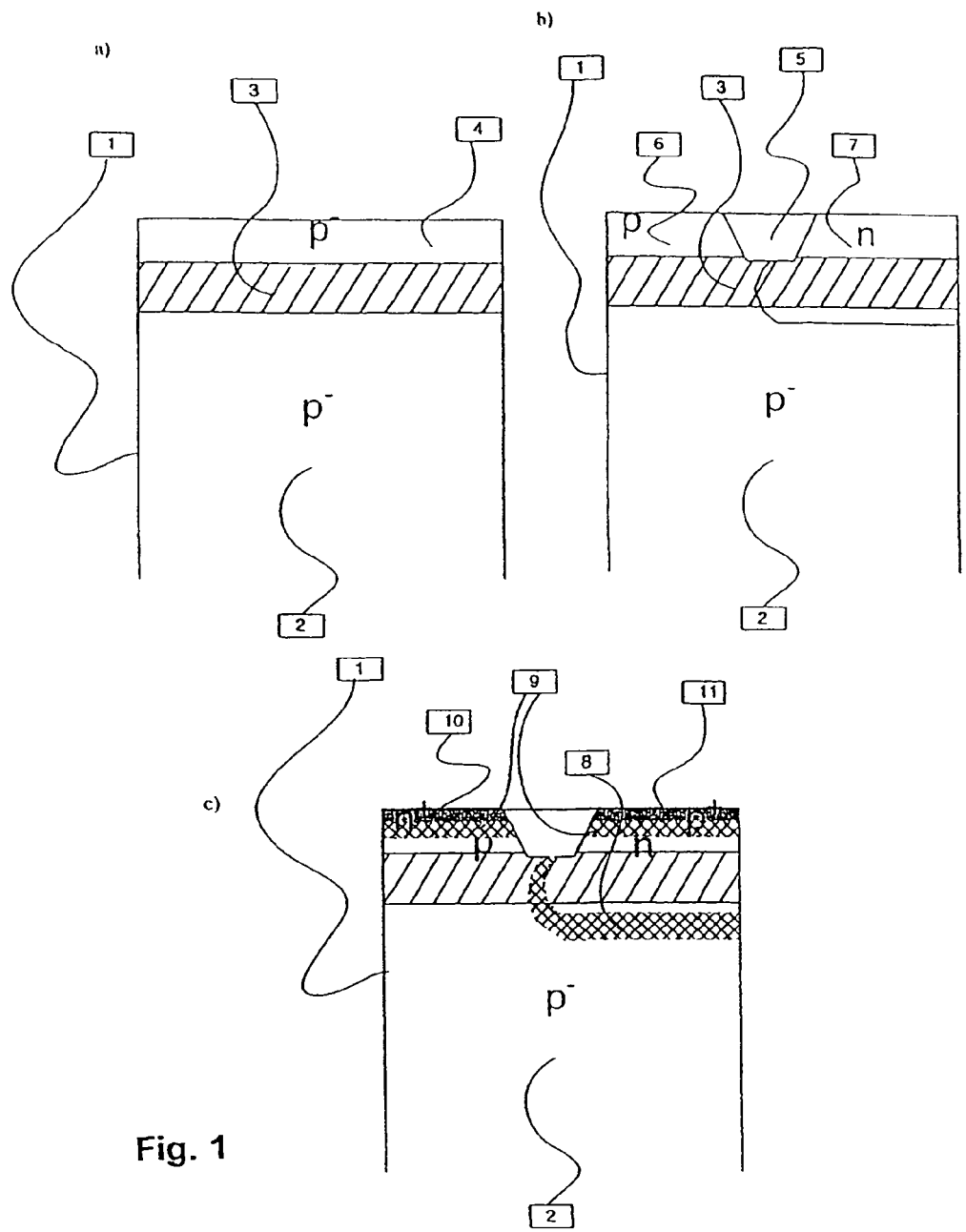

| | | | | |
|---|---|---|---|---|
| 4,920,396 | A | * | 4/1990 | Shinohara et al. ........... 257/376 |
| 4,956,693 | A | * | 9/1990 | Sawahata et al. ............ 257/611 |
| 5,024,723 | A | | 6/1991 | Goesele et al. |
| 5,578,507 | A | | 11/1996 | Kuroi |
| 5,661,043 | A | | 8/1997 | Rissman et al. |
| 6,153,920 | A | | 11/2000 | Gossmann et al. |

FOREIGN PATENT DOCUMENTS

| | | |
|---|---|---|
| DE | 4427715 | 8/1996 |
| DE | 19533313 | 3/1997 |
| DE | 19860701 | 7/2000 |
| EP | 0253059 | 1/1988 |
| EP | 0646970 | 4/1995 |
| WO | WO 9826456 | 6/1998 |
| WO | WO 9834281 | 8/1998 |

OTHER PUBLICATIONS

Frey, L. et al: "Deep implants for semiconductor device applications", Radiation Effects and Defects in Solids, 1996, Gordon & Breach, Switzerland, vol. 140, pp. 87-101 (XP008004021).

Heinemann, B. et al: "Latchup Immunity and Well Profile Design by A Deep Carbon-Doped Layer", IEDM 00, pp. 471-474, Year (2000).

Osten, Jorg H.: "MBE growth and properties of supersaturated, carbon-containing silicon/geranium alloys on Si(001)", Thin Solid Films 367 (2000), pp. 101-111.

Osten, Jorg H. et al: "Carbon-containing group IV heterostructures on Si: properties and device applications", Thin Solid Films 321 (1998), pp. 11-14.

Zerlauth, S. et al: "Molecular beam epitaxial growth and photoluminescence investigation of $Si_{1-y}C_y$ layers", Thin Solid Films 321 (1998), pp. 33-40.

Eberl, K. et al: "Pseudomorphic $S_{1-y}C_y$ and $Si_{1-x-y}Ge_xC_y$ alloy layers on Si", Thin Solid Films 294 (1997), pp. 98-104.

Kamiura, Yoichi et al: "Deep center related to hydrogen and carbon in $p$-type silicon", J. Appl. Phys. 78 (7), Oct. 1, 1995, pp. 4478-4486.

JP Patent Abstracts of Japan, Publication No. 07022330 A, Method for Forming Strain Hetero Epitaxial Layer, Jan. 24, 1995.

JP Patent Abstracts of Japan, Publication No. 05152304 A, Manufacture of Semiconductor Substrate, Jun. 18, 1993.

* cited by examiner

LAYERS IN SUBSTRATE WAFERS

BACKGROUND OF THE INVENTION

1. Field of the Invention

The invention relates to layers in substrate wafers as set forth in the classifying portion of claim 1.

2. Description of Related Art

Advantages in terms of power consumption, signal processing speed and production costs are to be expected in relation to previously known multi-chip structures if for example highly integrated processor circuits (digital circuitry technology) can be integrated with high-frequency circuits for transmitting and receiving components (analog circuitry technology) on a chip.

Such a combination of various circuit components of a digital and analog nature on a chip places high demands on technologists, component engineers and circuit developers. This results from the fact that the individual technology processes and component constructions are based on optimisation criteria which in part are in conflict or difficult to reconcile and in addition joint operation of the circuits on one chip can give rise to unwanted interactions.

Highly doped $p^+$-substrate wafers with a $p^-$-doped epilayer are typically used for the production of heavily scaled digital circuits in order to ensure a sufficient safeguard against the occurrence of latch-up, the thyristor-like firing of a four-layer arrangement as occurs for example in the case of CMOS-inverters, which is damaging in terms of the circuit function.

In contrast, the use of substrate wafers which are of as high resistance as possible is advantageous for high-frequency circuits in order to keep down currents which are capacitively or inductively coupled into the substrate, as they result in an increased power consumption, a reduction in quality in coils or so-called substrate noise. At the same time the influence of interference signals, for example from the digital circuits, on sensitive analog circuits, is reduced.

There are various approaches for simultaneously satisfying the various demands on the substrate properties in the combination of digital and analog high-frequency circuits on a chip. Thus A. Monroy et al, BCTM 1999, 7.3, involves the production of $n^+$- and $p^+$-regions which are buried by epitaxy and which are structured by means of an implantation mask on a $p^-$-substrate, in order to ensure both latch-up resistance by virtue of highly doped well regions and also low high-frequency losses by virtue of a high-resistance substrate. That procedure however gives rise to both additional costs due to additional process steps of structuring, well production and epitaxy and also limitations in regard to the design of minimal n- and p-well regions. Those limitations result from lateral displacement of the buried $n^+$ ($p^+$)-regions with respect to the n- and p-wells of the CMOS technology by virtue of mask maladjustment or by virtue of the lateral spread of the buried $n^+$ ($p^+$)-regions during deep diffusion.

The proposal by M. R. Frei et al, IEDM 1999, page 757, in which a buried $p^+$-layer is epitaxially introduced instead of the $p^+$-substrate, does admittedly circumvent the above-indicated difficulties, but it includes unsatisfactory compromises in regard to latch-up resistance or high-frequency substrate losses. The compromises follow in terms of latch-up resistance from the substrate resistance which is substantially increased with respect to a $p^+$-substrate while in terms of the high-frequency substrate losses the compromises arise out of the markedly lower level of substrate resistance and higher capacitances between n-wells and substrate in comparison with a $p^-$-substrate.

In order to effectively increase the latch-up resistance without a $p^+$-substrate or without highly conductive, epitaxially buried $n^+/p^+$-layers, it is necessary to improve the conductivity of the n- and p-wells.

R. Mahnkopf et al, JEDM 1999, page 849, reports that, in the case described there, even when foregoing a $p^+$-substrate, latch-up can be sufficiently suppressed if an additional masked boron implant is used. The arrangement described therein however does not include any proposal in terms of resolving the problem of shielding interference signals from nMOS-transistors by means of suitable doping profiles, as is achieved with A. Monroy et al, BCTM 1999, 7.3, by virtue of epitaxially buried $n^+$-regions which are contacted laterally by way of a collector shaft. In order to save on process expenditure and in order not to lose the scaling of highly integrated CMOS-circuits, which is achieved with a $p^+$-substrate, production of that transistor structure by implantation would be advantageous.

In that respect buried dopant profiles with the highest possible dose and steepness are to be aimed at. In regard to suitable implantation doses for so-called retrograde wells, consideration is to be given to various criteria as, because of latch-up resistance, layer resistances which are as low as possible are required, but levels of concentration which are sufficiently low, in relation to surface area, are necessary in order to ensure low source-drain capacitances and to be able to adjust the threshold voltage of the MOS-transistors independently of the retrograde well doping. In addition the possible dose range is limited, in accordance with the previous known state of the art, see for example K K Bourdelle, J Appl Phys, Vol 86, page 1221, 1999, as, in dependence on the kind of ion, in a given dose range which is preferably of interest for the production of retrograde wells, it is not possible for implantation damage to be defect-free restored.

H. J. Gossmann et al, IEDM 1998, page 725, produce a buried carbon layer by implantation in order to attenuate the reverse 'short-channel effect' in MOS-transistors. For the carbon doses required for that purpose however it is found that, in spite of positioning the maximum of the implantation profile in deeper zones which are not depleted in respect of mobile charge carriers, the source/drain diodes exhibit markedly increased leakage currents, whereby the use thereof in highly integrated circuits is in doubt.

Bogen et al, Proceedings of the 11th International Conference on Ion Implantation Technology, 1996, page 792, intend using the buried carbon layers produced by means of high-energy implantation for a reduction in the life and thus the diffusion length of minority carriers and finally for an increase in latch-up resistance. Because of the excessive depth of the layer introduced (>3 µm) however in the case of a typical current path, in the event of latch-up triggering, the desired effect would fail to occur unless, as also established by Gossmann et al, IEDM 1998, page 725, the lives were considerably reduced in the regions above the buried carbon layer. That reduction however is absolutely to be avoided as slight leakage currents are required in the space charge zones between source-drain regions and wells, but also at the n-well/p-substrate transition. The variants presented hitherto do not provide any way of satisfying that demand.

SUMMARY OF THE INVENTION

The object of the invention is to provide layers in substrate wafers, in which the above-described disadvantages of conventional arrangements are overcome in order, at comparatively low cost, on the one hand to achieve sufficient latch-up resistance in heavily scaled, digital CMOS circuits and on the other hand to ensure low substrate losses/coupling effects for analog high-frequency circuits and in addition not to damagingly influence the component performance.

In accordance with the invention that object is attained in that in a high-resistance p⁻-Si-substrate (2) with one or more buried carbon-rich Si-layers (3) under a Si-cap layer (4), which is epitaxially deposited, wherein the construction of the buried carbon-rich Si-layers is such that the properties of the components are not damagingly influenced, and in particular the source/drain leakage currents of MOS-transistors are not increased, by virtue of the suppression of dopant diffusion and defect generation when restoring implant damage, an implantation dose which is greater in comparison with conventional substrate wafers is used for retrograde well profiles and thus a reduction in the well resistance and finally an increase in the latch-up resistance is achieved, and the bipolar interaction mechanisms, upon triggering of latch-up, are obstructed by the local reduction in the charge carrier life. The thickness of the carbon-rich Si-layer (3) and that of the Si-cap layer (4) are such that neither the depletion zone between an n-well and the p⁻-Si-substrate (2) nor the depletion zones between the source-drain regions of MOS-transistors and the p- and n-wells reach the carbon-rich Si-layer (3) under operating conditions. The concentration of the carbon is in the carbon-rich Si-layer or layers (3, 33) between $2\times10^{18}$ cm⁻³ and $3\times10^{20}$ cm⁻³, preferably between $5\times10^{18}$ cm⁻³ and $5\times10^{20}$ cm⁻³. After restoration of implantation damage for implantation doses over $3\times10^{13}$ cm⁻² slight defect densities are present in the Si-cap layer (4) near the surface, of less than $10^4$ cm⁻². The manner of introducing and the position of those layers is so selected that the latch-up resistance can be improved in many respects in comparison with conventional structures. The local reduction in the charge carrier life and thus the diffusion length of the minority charge carriers in the carbon-rich Si-layer obstructs the bipolar interaction mechanisms upon triggering of latch-up. In addition the buried, carbon-rich Si-layers permit suppression of spot defect-supported production of crystal imperfections during restoration of implantation damage. In that way, in comparison with conventional, pure Si-substrates, it is possible to increase the range of implantation doses for retrograde well profiles which leave behind regions which are sufficiently low in defects, in the proximity of the surface. In addition there is an increase in the level of freedom in the configuration of the implantation profiles for the more deeply disposed, more highly conductive layers of the n- and p-wells due to the local suppression of TED in the surroundings of the buried, carbon-rich Si-layers during the restoration of implantation damage.

In this respect the construction of the buried carbon-rich Si-layers is such that the properties of the components of a given CMOS- or BiCMOS-technology are substantially not influenced and in particular the source/drain leakage currents are not increased.

DETAILED DESCRIPTION OF THE DRAWING

Figure 2:
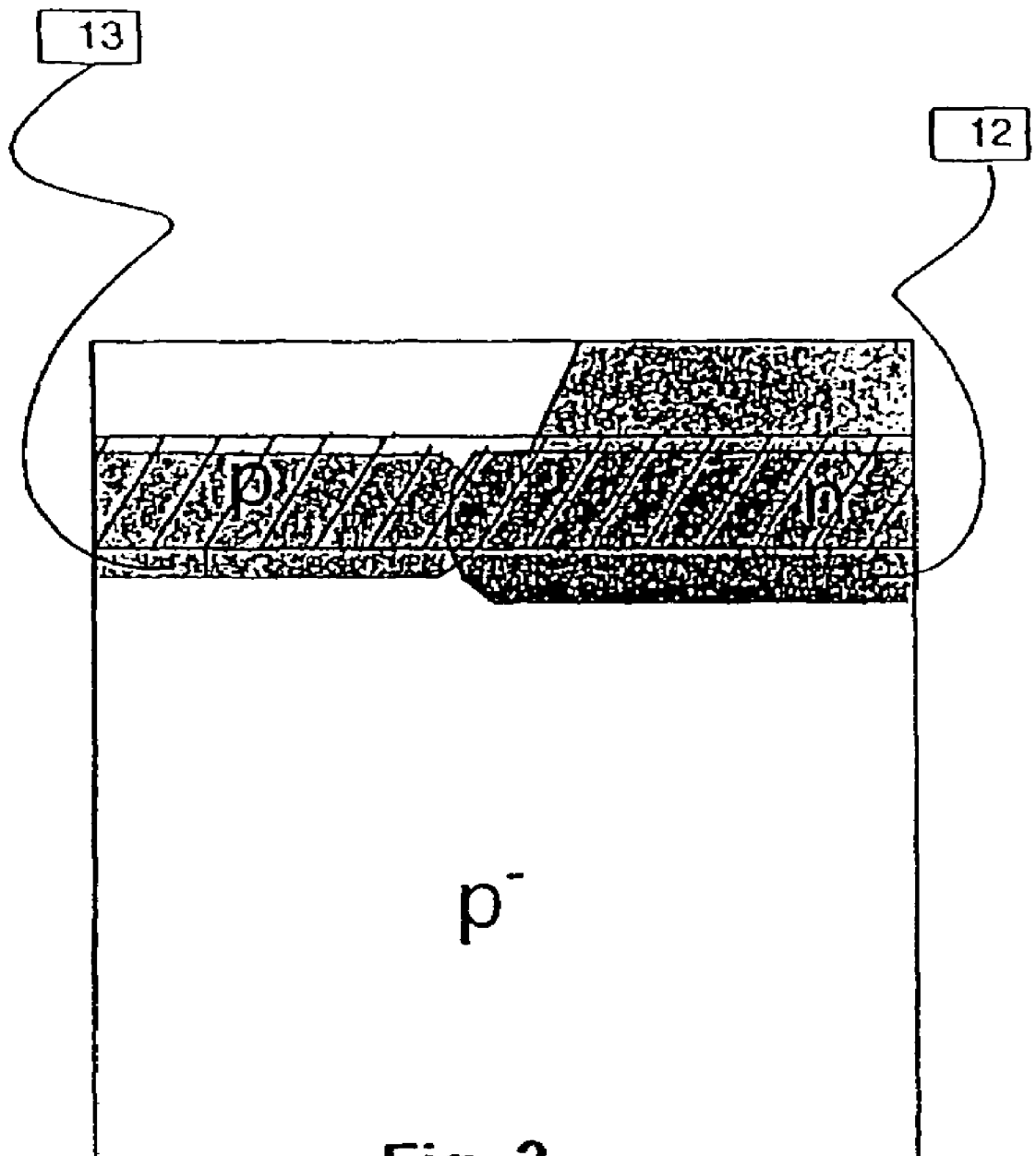
Figure 3:
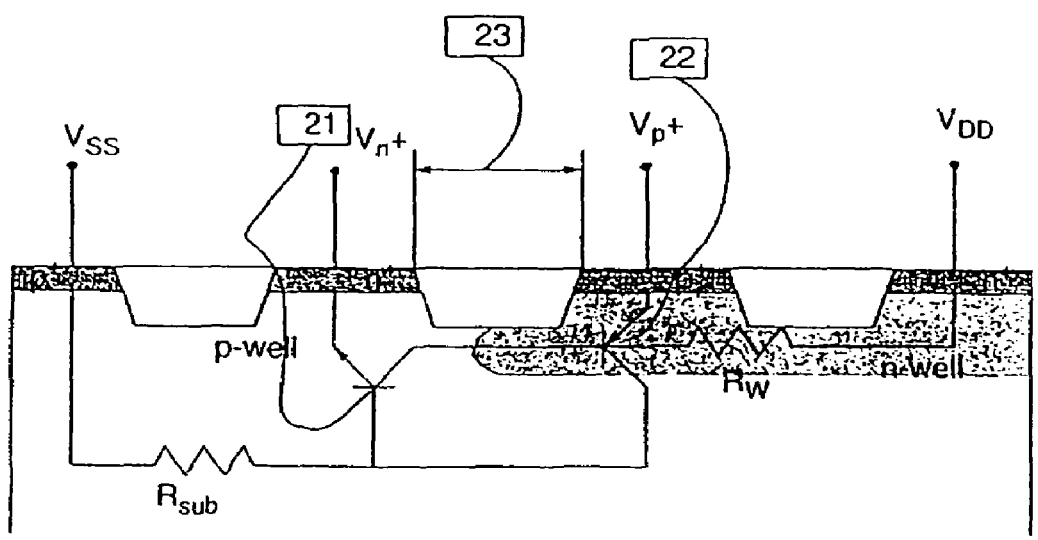
Figure 4:
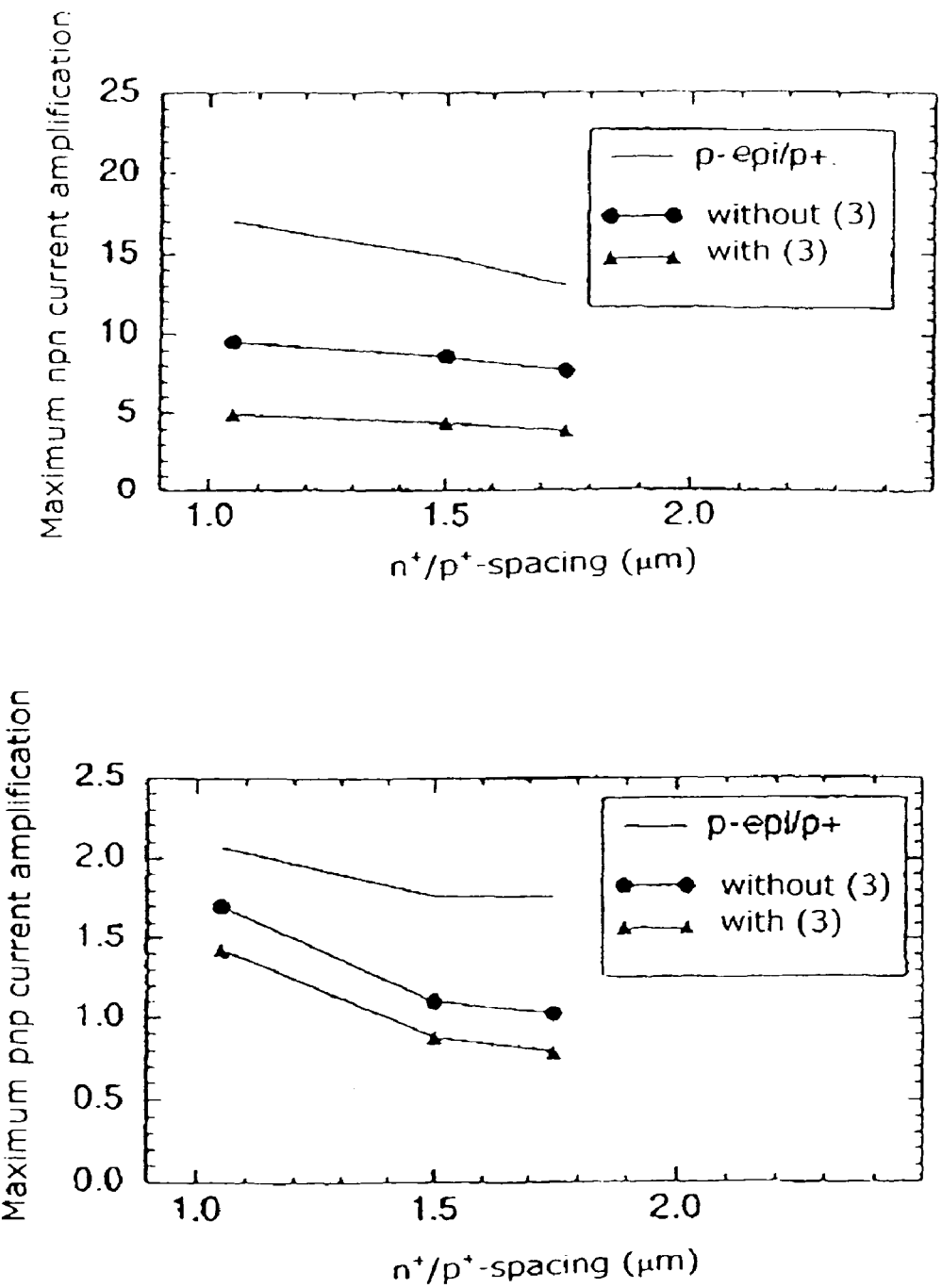
Figure 5:
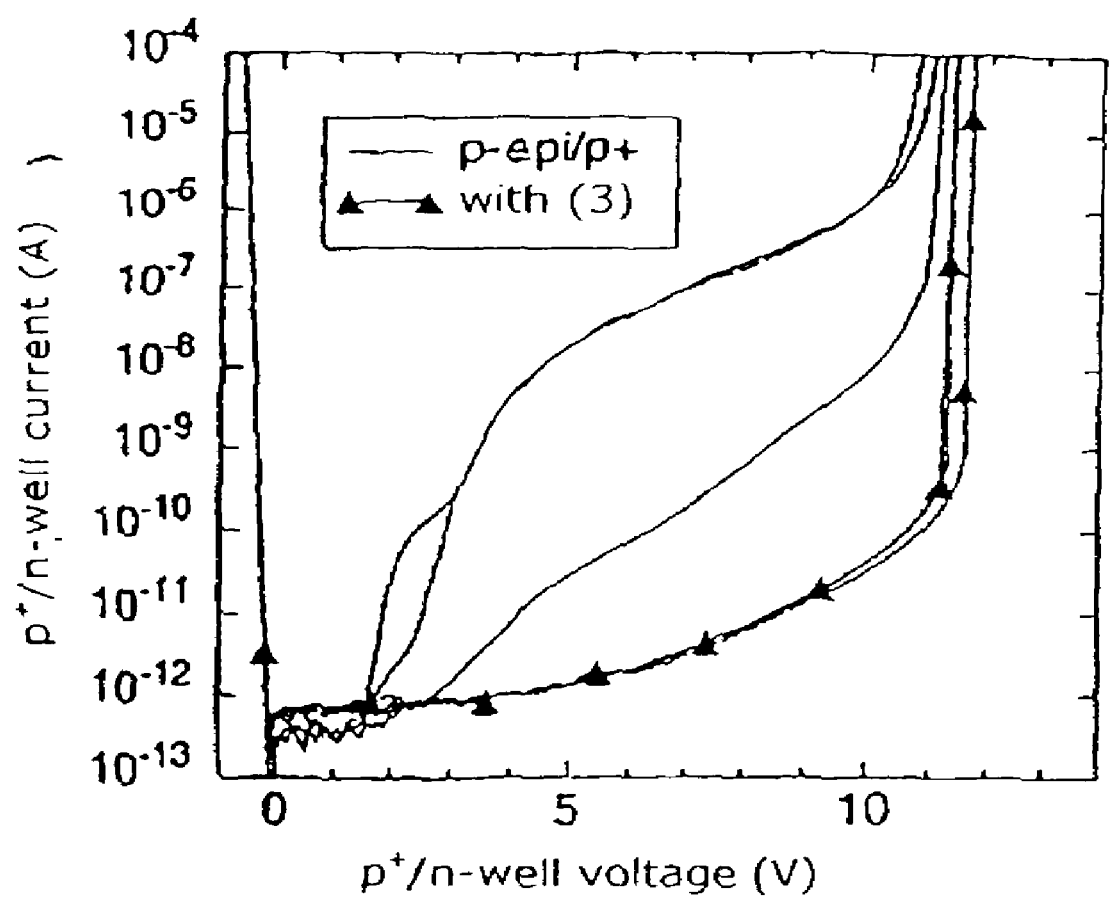
Figure 6:
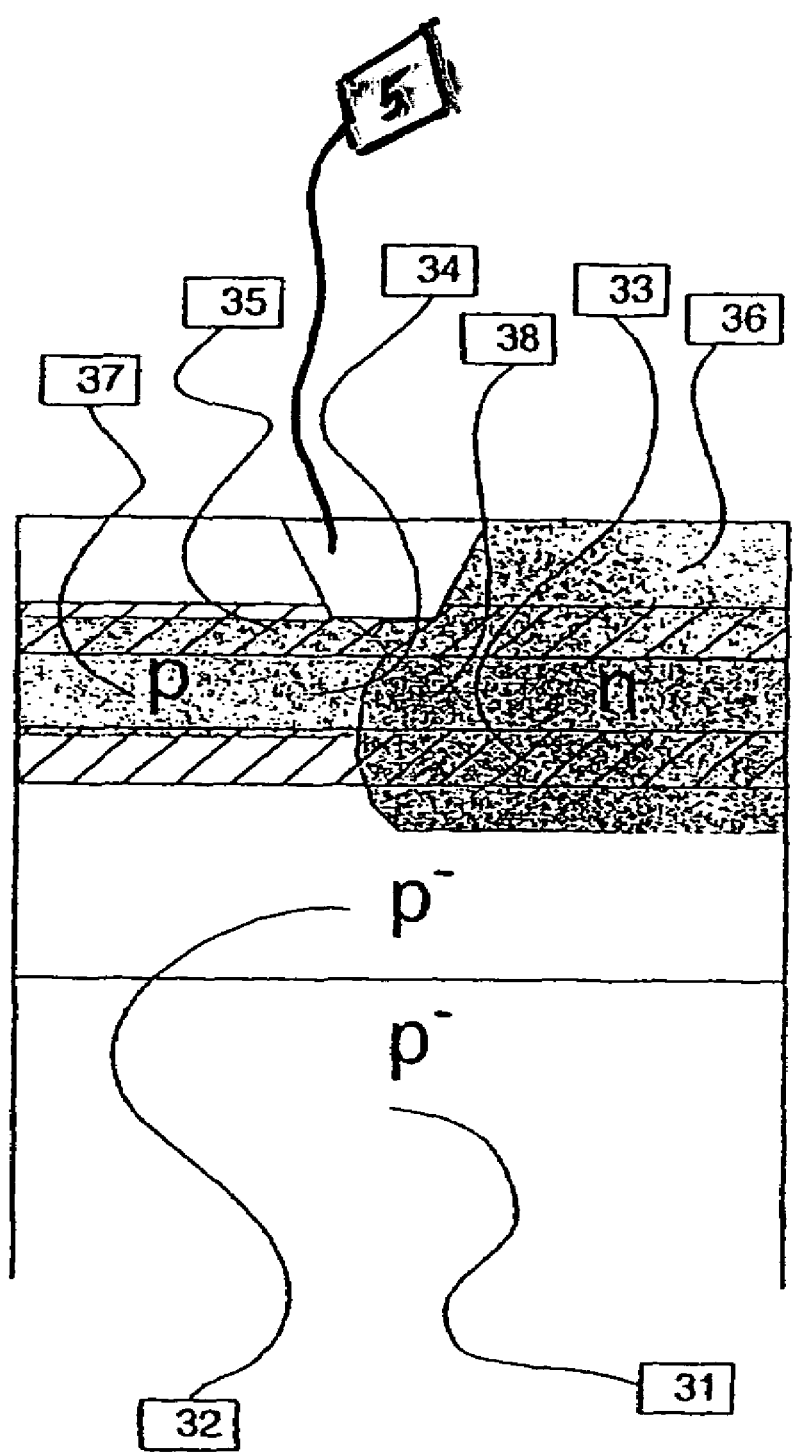
Figure 7:
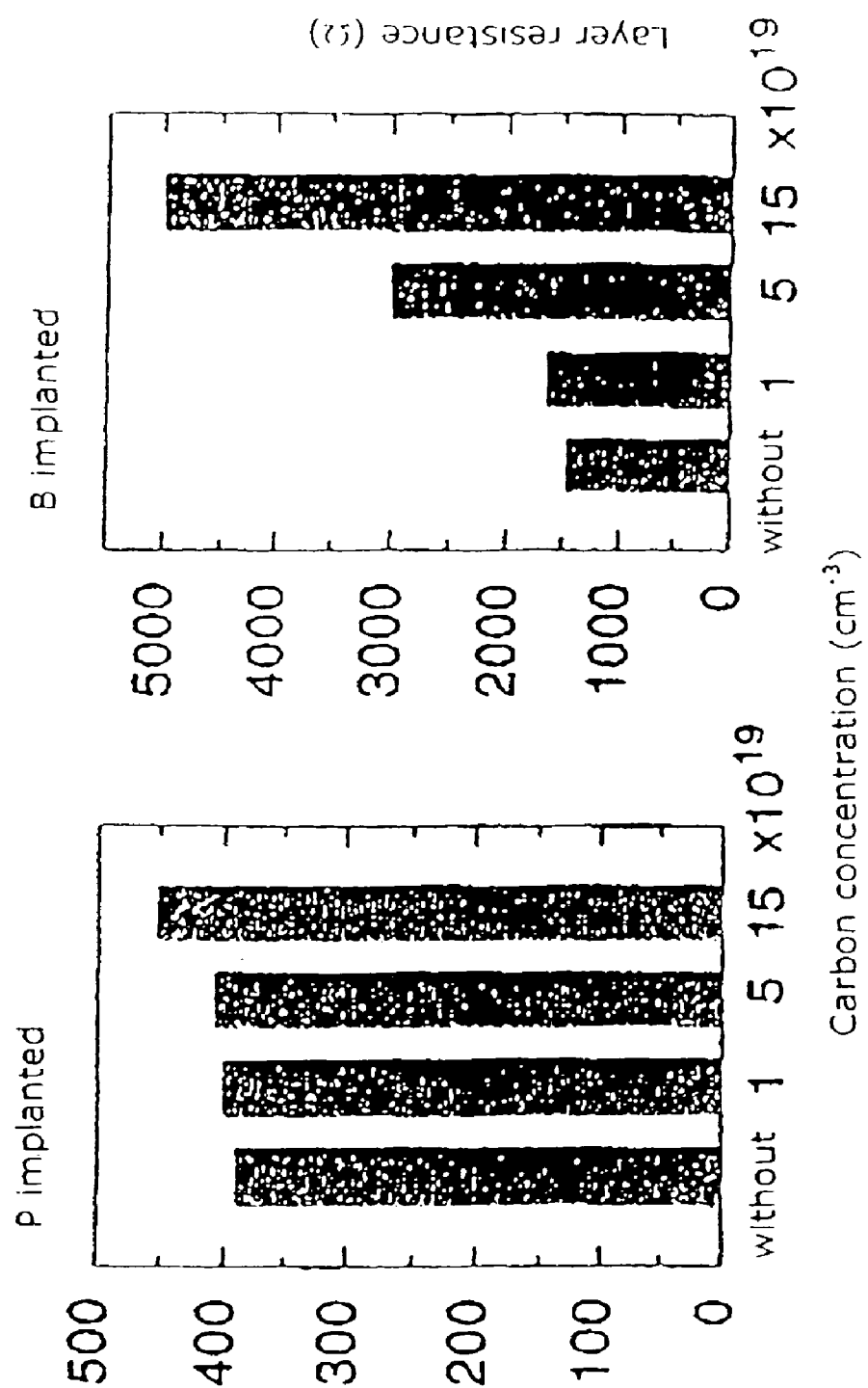
Figure 8:
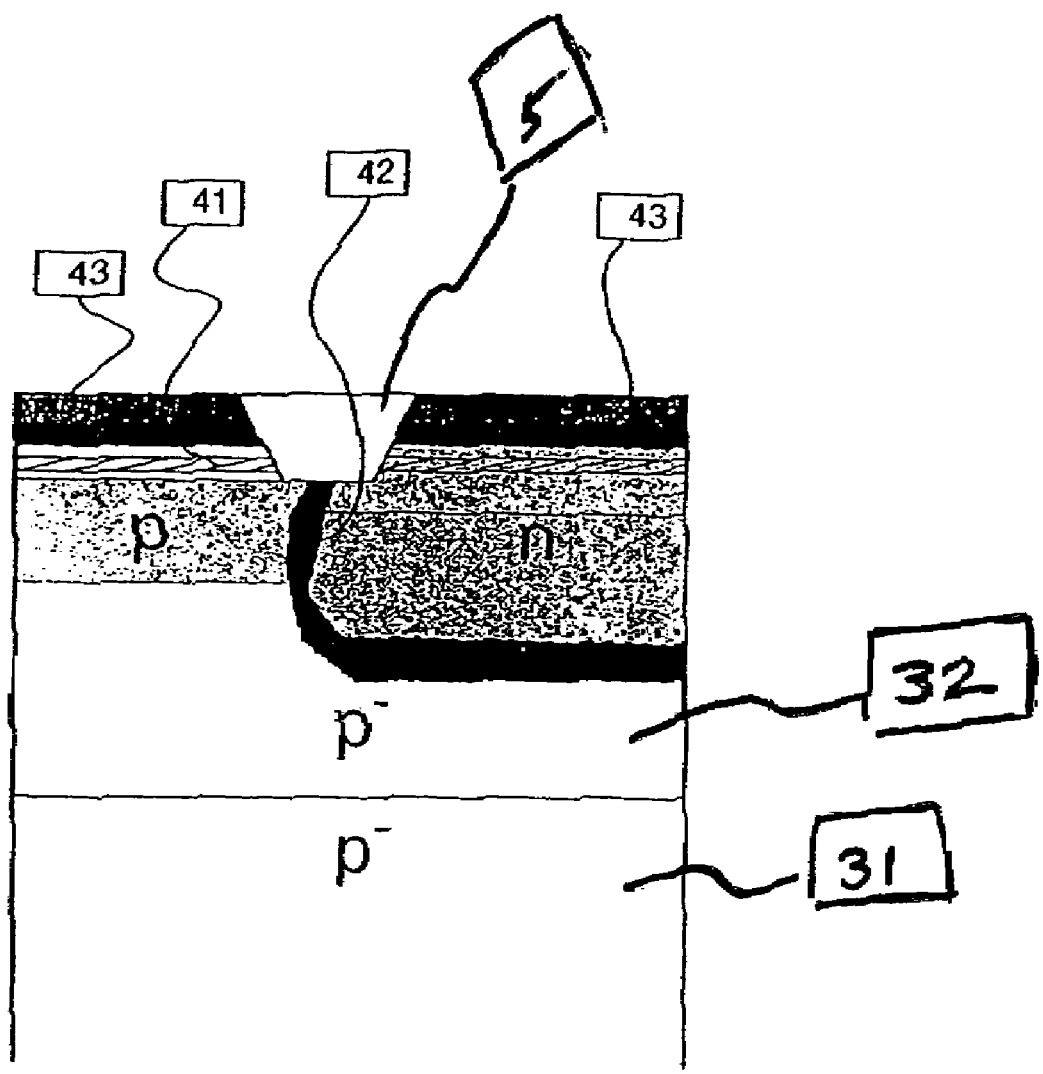

Besides the claims, the features of the invention are also to be found in the description and the drawings, in which respect the individual features in themselves alone or as a plurality in the form of sub-combinations represent patentable embodiments for which protection is claimed here. Embodiments by way of example of the invention are described in greater detail hereinafter and illustrated in the drawings in which:

FIG. 1a is a diagrammatic view with layers according to the invention of the substrate wafer 1 with a buried carbon-rich Si-layer 3, FIG. 1b is a diagrammatic view with layers according to the invention as in FIG. 1a and also with an insulating region 5 as well as p- and n-wells 6, 7, which are produced in the CMOS-process, FIG. 1c shows a diagrammatic view with layers according to the invention as in FIG. 1b and in addition with a space charge zone 8 between an n-well 7 and p⁻-substrate 2 or a p-well 6 and space charge zones 9 between n⁺- and p⁺-source/drain regions 10, 11 respectively and the wells 6, 7, FIG. 2 is a diagrammatic view with layers according to the invention as in FIG. 1b and also with additional doping 12-13 under the n- and p-wells 7, 6, FIG. 3 is a diagrammatic view of the parasitic npn- and pnp-bipolar transistor arrangement 21/22, FIG. 4 shows measured current amplifications of the parasitic bipolar transistor arrangements as a function of the n⁺/p⁺-spacing, FIG. 5 shows measured leakage current characteristic curves of the p⁺-source/drain-n-well diode, FIG. 6 is a diagrammatic view with layers according to the invention with two buried carbon-rich Si-layers, FIG. 7 shows the layer resistance of n- and p-doped carbon-rich Si-layers respectively for various levels of carbon concentration in comparison with conventional Si-wafers, and FIG. 8 shows a diagrammatic view of layers according to the invention with a buried carbon-rich Si-layer.

DETAILED DESCRIPTION OF THE INVENTION

The invention is described with reference to a state-of-the-art CMOS-process. It will be appreciated that modifications of that process such as for example the introduction of process modules for BiCMOS-technologies are equally possible.

EXAMPLE 1

This example illustrated in FIGS. 1a, 1b, 1c diagrammatically show the essential details according to the invention. FIG. 1a shows the layers according to the invention of the substrate wafer 1, comprising the p⁻-substrate 2 and the buried carbon-rich Si-layer 3. Also in FIG. 1b with the insulating region 5 and the p- and n-wells 6, 7 which are produced in the CMOS process and in FIG. 1c with a space charge zone 8 between the n-well 7 and the p-substrate 2 or the p-well 6 respectively and space charge zones 9 between n⁺- and p⁺-source/drain regions 10, 11 respectively and the wells 6/7. The concentration of carbon in the carbon-rich Si-layer 3 can be between $2\times10^{18}$ cm⁻³ and $3\times10^{20}$ cm⁻³, preferably between $5\times10^{18}$ cm⁻³ and $5\times10^{18}$ cm⁻³. Deposited epitaxially, for example by means of CVD, over the carbon-rich Si-layer 3, is a (low-carbon) Si-cap layer 4 which contains a low level of dopant concentration of less than $1\times10^{17}$ cm⁻³, preferably below $1\times10^{16}$ cm⁻³.

EXAMPLE 2

The substrate wafer 1 is produced in the following manner, prior to the actual CMOS process procedure. A carbon-rich Si-layer 3, as characterised in Example 1, is buried on a substrate wafer 1 consisting of a p-substrate 2 which is of as high resistance as possible, epitaxially by means of a chemical vapor deposition (CVD) process. In the operation of depositing the Si-cap layer 4 it is possible to use both high-temperature (HT)- and also low-temperature (LT)-epitaxy. Then, shallow trenches are produced on the substrate layer 1 with the CMOS process procedure as insulating regions 5 between the p-well 6 and the n-well 7. The thickness of the carbon-rich Si-layer 3 and that of the Si-cap layer 4 are preferably to be so selected that neither the depletion zone 8 between the n-well 7 and the p⁻-Si-substrate 2 nor the depletion zones 9 between the source-drain regions of MOS-transistors 10 and 11 and the wells 6/7 reach the carbon-rich Si-layer 3 under operating conditions.

EXAMPLE 3

In a modification of the production process described in Example 2 it is also possible to produce a low-defect, single-crystal, carbon-rich Si-layer by a procedure whereby carbon is implanted in high doses and the disturbed crystal lattice is then reconstructed by means of solid-phase epitaxy.

EXAMPLE 4

In this embodiment an approximately 300 nm thick carbon-rich Si-layer (3) with a carbon concentration of approximately $1 \times 10^{19}$ cm$^{-3}$ and an Si-cap layer 4 of 500 nm were deposited by means of LT-CVD epitaxy on a commercially available p⁻-substrate 2 with a conductivity of 30-60 Ωcm. The electrically active dopant concentration in the carbon-rich Si-layer 3 and in the Si-cap layer 4 is below $5 \times 10^{15}$ cm$^{-3}$. After production of the substrate wafer 4 a high-temperature step was applied to the wafer, for example at 1000° C./1 h. This provides that the carbon distribution in the carbon-rich Si-layer 3 is no longer substantially altered even during subsequent temperature treatments. That high-temperature step can also be implemented during the subsequent CMOS-process. Subsequently the substrate arrangement according to the invention is tested on the basis of a typical dual gate 0.25 μm CMOS-process with shallow trench insulation, retrograde p- and n-wells, Co-silication and aluminum metallisation.

EXAMPLE 5

In a modification in relation to the production processes as described in the foregoing Examples, it is advantageous to introduce an additional doping 12, 13 (see FIG. 2) in relation to the p- and n-wells 6, 7 in order to increase the latch-up resistance. The additional doping 12 is introduced prior to the implantation operations for the p- and n-wells 6, 7. In this embodiment, for the additional doping 12, phosphorus is separately implanted by a mask and restored. It can be used selectively both under the p-wells for electrical screening of the nMOS transistors and also under the n-wells for improving latch-up resistance. The same design rules are used for that mask step, as for the n-well 7. In addition, the additional doping 13 for the p-well has been introduced as an additional boron implant with the lacquer mask for the p-well. The energy and dose of those implants (300 keV/$2 \times 10^{13}$ cm$^{-2}$ for boron and 750 keV/$5 \times 10^{13}$ cm$^{-2}$ for phosphorus) are so selected that the threshold voltage-determining doping of the regions near the surface is not altered.

EXAMPLE 6

The effect of the carbon-rich Si-layer in respect of the electrical properties, in particular the latch-up behaviour, was tested experimentally with the arrangement of the layers as produced and described in the preceding Examples. The influence on the latch-up behaviour is investigated by means of the test structure shown in FIG. 3. The Figure symbolically illustrates the parasitic npn- 21 and parasitic pnp-bipolar transistor arrangement 22 as well as the n⁺-p⁺-spacing 23 which is characteristic of the latch-up behaviour. Caused by the higher conductivity which is achieved by means of the additional doping 12, 13 and the reduced diffusion length of the minority carriers in the carbon-rich Si-layer 3, the current amplification of the parasitic npn- and pnp-bipolar transistor arrangements 21, 22 falls for the arrangement with carbon-rich Si-layer in comparison with the p⁻-epi/p⁺-standard variant or in relation to the case of a p⁻-substrate with additional doping but without a carbon-rich Si-layer. FIG. 5 shows by reference to the leakage currents between the p⁺-source/drain and n-wells for the variant with a carbon-rich Si-layer 3, in comparison with the comparative variants, minor defect densities in the Si-cap layer 4 near the surface, after the restoration of implantation damage. This means that greater implantation doses can be used for the deeper parts of the well profiles when using the carbon-rich Si-layer 3, for an equal leakage current level.

EXAMPLE 7

The arrangement shown in FIG. 6 combines further features of the present invention. A p⁻-Si-buffer layer 32 has been deposited on a p⁻-substrate 31 of 30-60 Ωcm. The task of that layer is to provide a zone with a low oxygen content between the substrate 31 and the subsequent cover layers. The thickness of the p⁻-Si-buffer layer 32 can be between 0.2 μm and 10 μm, preferably 2 μm. The deposition operation can be implemented with a conventional LT- or HT-CVD epitaxial process, preferably with HT-CVD epitaxy. A first carbon-rich Si-layer 33 is then deposited. LT-CVD or implantation can be used for the production procedure, as described in Example 1. The thickness is in the range of between some 10 nm and 2000 nm, preferably between 50 nm and 600 nm. A carbon concentration in the range of between $5 \times 10^{18}$ cm$^{-3}$ and $3 \times 10^{20}$ cm$^{-3}$, preferably $5 \times 10^{18}$ cm$^{-3}$ and $1 \times 10^{20}$ cm$^{-3}$ is to be set. A weakly doped Si-intermediate layer 34 is produced over the first carbon-rich Si-layer 33 by means of a conventional CVD process. The thickness can be between 100 nm and 1000 nm, preferably at between 300 nm and 600 nm. A second carbon-rich Si-layer 35 follows over the Si-intermediate layer 34, the carbon concentration thereof being less than or similar to the concentration which is used in relation to the first carbon-rich Si-layer 33. The substrate arrangement according to the invention is completed over the second carbon-rich Si-layer 35 by a weakly doped, epitaxially produced Si-cap layer 36. The thickness can be between 100 nm and 600 nm, preferably between 300 nm and 500 nm. In order to improve the latch-up resistance in relation to the arrangement of Example 1, the energy and dose of the boron or phosphorus implantations have been increased for the additional doping 37, 38. The boron implant for the additional doping 37, which is in addition in comparison with the CMOS-standard process and which is introduced jointly with the p-well has been produced with an energy of 400 keV and a dose of $6 \times 10^{13}$ cm$^{-2}$. The energy of the phosphorus implant for the additional doping 38 is determined substantially by the following requirements: on the one hand the aim is to provide for good conductivity of the buried n-layer produced by the phosphorus implant under a p-well, for the purposes of electrical shielding of nMOS-transistors. A sufficiently high implantation energy is necessary for that purpose to avoid compensation by the additional doping 37. On the other hand the additional doping 38 can be introduced into the n-well regions. In order to be able to apply the same design rules for the additional doping 38 and for the n-well the implantation energy is limited upwardly by the lacquer thickness which is the maximum permitted for that. Based on the data selected in this Example in respect of energy and dose of the additional doping 37, the specified requirements for the phosphorus implant afford an energy range of between 0.9 MeV and 1.3 MeV. Besides the requirement for good conductivity the dose value for the phosphorus implant is governed by the condition that the electrical behaviour of the pMOS-transistors is not to be influenced by any profile offshoots at the surface. That results in a suitable dose range of between $2\times10^{13}$ cm$^{-2}$ and $5\times10^{14}$ cm$^{-2}$. Additional limitations in respect of the dose can arise out of the requirement for low-defect restoration of implantation damage. The aim in that respect is to keep down the leakage currents between source/drain and well regions. In order to achieve a high yield of bipolar transistors with an epitaxially produced base layer in BiCMOS-processes, a high level of crystal perfection after the restoration operation is also required. The position of the first carbon-rich Si-layer 33 is so selected that the mutually opposite n- and p-profiles of the additional doping remain as steep as possible during the subsequent procedures. In addition that layer is intended to effectively reduce the diffusion length of minority carriers which are injected from the n-well into the substrate. Furthermore, by way of suitable adjustment of the carbon content, the electrical resistance can be markedly increased in a localised fashion in the p$^-$-region of the carbon-rich Si-layer 33 under the p-well while the conductivity of the n-doped part of the carbon-rich Si-layer remains substantially uninfluenced. That behaviour is apparent from the view of the layer resistance of n- or p-doped carbon-rich Si-layers with differing levels of carbon concentration in FIG. 7. That measure provides that the potential drop in the p-well is reduced and as a result triggering of latch-up is made more difficult. The introduction of the Si-intermediate layer 34 has the advantage that the main part of the additional doping 37 of the p-well does not suffer from any loss of conductivity due to the inclusion of carbon. In addition that reduces the carbon-rich region between the p- and n-wells, which is depleted in respect of charge carriers, thereby reducing leakage currents.

The function of the second carbon-rich Si-layer 35 is to counteract an enlargement of the implantation profiles of the additional doping during the subsequent procedures. In addition charge carriers recombine to an increased degree in that region which is sensitive in respect of latch-up, whereby triggering of latch-up is made more difficult. Double and multiple layers with differing levels of C-concentration are suitable for adjusting conductivity differences in the carbon-rich Si-layers.

EXAMPLE 8

A further embodiment is illustrated in FIG. 8. As described in Example 6 a p$^-$-Si-buffer layer 32 and a carbon-rich Si-layer 41 are deposited on a p$^-$-substrate wafer 31. Disposed thereover is an epitaxially produced Si-cap layer. Unlike the above-described arrangements the carbon-rich Si-layer 41 is completely above the upper edge of the insulating regions. This arrangement ensures that the space charge zone 42 between the n-well and the p-substrate does not have any overlap with respect to the carbon-rich Si-layer 41 and thus leakage currents are reduced. In addition the thickness of the carbon-rich Si-layer 41 is to be kept so small that there is no contact with the space charge zones 43 between the source/drain regions and the n- or p-wells.

In the present description the layers according to the invention in substrate wafers were set forth with reference to specific embodiments. It should be noted however that the present invention is not limited to the details of the description in the specific embodiment as alterations and modifications are claimed within the scope of the claims.

The invention claimed is:

1. A high-resistance p$^-$-Silicon substrate wafer, comprising:
   a p$^-$-Silicon substrate;
   an epitaxial Silicon cap layer disposed above the p$^-$-Silicon substrate;
   one or more buried epitaxial carbon-rich Silicon layers under and in contact with the epitaxial Silicon cap layer and above the p$^-$-Silicon substrate;
   one or more p-wells arranged fully above the p$^-$-Silicon substrate;
   one or more n-wells arranged partially above the p$^-$-Silicon substrate;
   source and drain regions for a plurality of MOS transistors in the Silicon cap layer;
   a first depletion zone formed in the p$^-$-Silicon substrate and associated with a first p-n junction formed by the one or more n-wells and the p$^-$-Silicon substrate; and
   at least one second depletion zone formed in the epitaxial Silicon cap layer and associated with a second p-n junction formed by the source and drain regions and the one or more n-wells;
   wherein the one or more buried epitaxial carbon-rich Silicon layers and the epitaxial Silicon cap layer each have a respective thickness such that under operating conditions neither
   a) a horizontal depletion-zone portion of the first depletion zone extending parallel to a top surface of the high-resistance p$^-$-Silicon substrate wafer and not including another depletion-zone portion of the first depletion zone bending towards the top surface of the high-resistance p$^-$-Silicon substrate wafer, nor
   b) the at least one second depletion zone,
   change their respective extension in a depth direction that is perpendicular to the surface of the high-resistance p$^-$-Silicon substrate wafer to an extent that any of said horizontal depletion-zone portion and said at least one second depletion zone reach any of the one or more buried epitaxial carbon-rich Silicon layers.

2. The high-resistance p$^-$-Silicon substrate wafer of claim 1, wherein the carbon concentration in the one or more buried epitaxial carbon-rich Silicon layers is between $2\times10^{18}$ cm$^{-3}$ and $3\times10^{20}$ cm$^{-3}$.

3. The high-resistance p$^-$-Silicon substrate wafer of claim 1, wherein the one or more buried epitaxial carbon-rich Silicon layers consist of only one buried epitaxial carbon-rich Silicon-layer which is completely above a lower edge of insulating regions, wherein said lower edge faces away from the top surface of the high-resistance p$^-$-Silicon substrate wafer.

4. The high-resistance p$^-$-Silicon substrate wafer of claim 1, wherein said p$^-$-Silicon substrate has a conductivity of 30 to 60 Ohm×cm.

5. The high-resistance p$^-$-Silicon substrate wafer of claim 1, wherein an electrically active dopant concentration in the one or more buried epitaxial carbon-rich Silicon layers is less than $5\times10^{15}$ cm$^{-3}$.

6. The high-resistance p$^-$-Silicon substrate wafer of claim 1, wherein the Silicon cap layer has a thickness of 500 nm.

7. The high-resistance p$^-$-Silicon substrate wafer of claim 1, wherein one of the one or more buried epitaxial carbon-rich Silicon layers has a thickness of approximately 300 nm.

8. The high-resistance p$^-$-Silicon substrate wafer of claim 1, wherein the one or more p-wells have a dopant dosage of at least $2\times10^{13}$ cm$^{-2}$.

9. The high-resistance p$^-$-Silicon substrate wafer of claim 1, wherein the one or more n-wells have a dopant dosage of between $2\times10^{13}$ cm$^{-2}$ and $5\times10^{14}$ cm$^{-2}$.

10. The high-resistance p$^-$-Silicon substrate wafer of claim 1, wherein the carbon concentration in the one or more buried epitaxial carbon-rich Silicon layers is between $5\times10^{18}$ cm$^{-3}$ and $5\times10^{19}$ cm$^{-3}$.

* * * * *